(12) United States Patent
Zhang

(10) Patent No.: US 12,307,959 B2
(45) Date of Patent: May 20, 2025

(54) DISPLAY SUBSTRATE INCLUDING A DOUBLE-GATE TRANSISTOR AND VOLTAGE STABILIZING TRANSISTOR

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Tiaomei Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/021,866

(22) PCT Filed: Jan. 29, 2022

(86) PCT No.: PCT/CN2022/075027
§ 371 (c)(1),
(2) Date: Feb. 17, 2023

(87) PCT Pub. No.: WO2023/142049
PCT Pub. Date: Aug. 3, 2023

(65) Prior Publication Data
US 2024/0265863 A1  Aug. 8, 2024

(51) Int. Cl.
*G09G 3/3225* (2016.01)
*H10K 59/121* (2023.01)
*H10K 59/131* (2023.01)

(52) U.S. Cl.
CPC ... *G09G 3/3225* (2013.01); *G09G 2300/0426* (2013.01); *G09G 2300/0819* (2013.01);
(Continued)

(58) Field of Classification Search
None
See application file for complete search history.

(56) References Cited

U.S. PATENT DOCUMENTS

2021/0242300 A1* 8/2021 Kwak ............... H10K 59/1216
2021/0397207 A1  12/2021 Joo et al.
(Continued)

FOREIGN PATENT DOCUMENTS

| CN | 111445856 A | 7/2020 |
|---|---|---|
| CN | 113035925 A | 6/2021 |

(Continued)

*Primary Examiner* — Benjamin C Lee
*Assistant Examiner* — Emily J Frank
(74) *Attorney, Agent, or Firm* — WHDA, LLP

(57) ABSTRACT

A display substrate includes: a base substrate, a plurality of sub-pixels arranged on the base substrate, a plurality of reference signal lines and a plurality of first light emitting control lines; the sub-pixel includes a sub-pixel driving circuit, and the sub-pixel driving circuit includes: a driving transistor, a compensation transistor, a voltage stabilizing transistor and a first conductive connection portion; a first electrode of the compensation transistor is coupled to a second electrode of the driving transistor, a second electrode of the compensation transistor is coupled to a gate electrode of the driving transistor, and the compensation transistor includes a double-gate transistor, the double-gate transistor includes two sub-transistors connected in series, and active patterns of the two sub-transistors are coupled to form an intermediate node; a gate electrode of the voltage stabilizing transistor is coupled to a corresponding first light emitting control line.

17 Claims, 8 Drawing Sheets

(52) U.S. Cl.
CPC ............... *G09G 2300/0842* (2013.01); *G09G 2300/0861* (2013.01); *G09G 2320/0247* (2013.01); *H10K 59/1213* (2023.02); *H10K 59/1216* (2023.02); *H10K 59/131* (2023.02)

(56) References Cited

U.S. PATENT DOCUMENTS

| | | | |
|---|---|---|---|
| 2022/0019757 A1* | 1/2022 | Han | H10K 59/65 |
| 2022/0102459 A1* | 3/2022 | Yang | H10K 59/1216 |
| 2022/0172681 A1* | 6/2022 | Kim | G09G 3/3266 |
| 2022/0199656 A1 | 6/2022 | Wang et al. | |
| 2022/0284862 A1 | 9/2022 | Dong | |
| 2022/0320212 A1* | 10/2022 | Gui | H10D 64/27 |
| 2022/0320221 A1* | 10/2022 | Wang | H10D 86/441 |
| 2022/0367602 A1 | 11/2022 | Li et al. | |
| 2023/0343293 A1* | 10/2023 | Gai | G09G 3/3233 |
| 2023/0410745 A1* | 12/2023 | Guo | G09G 3/3233 |

FOREIGN PATENT DOCUMENTS

| | | | |
|---|---|---|---|
| CN | 113785348 A | 12/2021 | |
| CN | 113900467 A | 1/2022 | |
| EP | 3686875 A1 | 7/2020 | |
| WO | 2022000233 A1 | 1/2022 | |

\* cited by examiner

DISPLAY SUBSTRATE INCLUDING A DOUBLE-GATE TRANSISTOR AND VOLTAGE STABILIZING TRANSISTOR

CROSS-REFERENCE TO RELATED APPLICATION

This application is the U.S. national phase of PCT Application No. PCT/CN2022/075027 filed on Jan. 29, 2022, which is incorporated herein by reference in its entirety.

TECHNICAL FIELD

The present disclosure relates to the field of display technology, in particular to a display substrate and a display device.

BACKGROUND

In recent years, with the rapid development of the display industry, rigid liquid crystal screens are gradually unable to meet people's needs. Therefore, organic light emitting diode displays, which are known for their flexibility, have emerged as the times require. Organic light emitting diode displays not only have good flexibility, but also have the advantages of thinness, low power consumption, fast response speed, wide viewing angle, etc., and are widely used in various fields.

SUMMARY

An object of the present disclosure is to provide a display substrate and a display device.

In order to achieve the above-mentioned object, the present disclosure provides the following technical solutions.

In one aspect, the present disclosure provides in some embodiments a display substrate, including: a base substrate, a plurality of sub-pixels arranged on the base substrate, a plurality of reference signal lines and a plurality of first light emitting control lines; wherein the sub-pixel includes a sub-pixel driving circuit, and the sub-pixel driving circuit includes: a driving transistor, a compensation transistor, a voltage stabilizing transistor and a first conductive connection portion; a first electrode of the compensation transistor is coupled to a second electrode of the driving transistor, a second electrode of the compensation transistor is coupled to a gate electrode of the driving transistor, and the compensation transistor includes a double-gate transistor, the double-gate transistor includes two sub-transistors connected in series, and active patterns of the two sub-transistors are coupled to form an intermediate node; a gate electrode of the voltage stabilizing transistor is coupled to a corresponding first light emitting control line, a first electrode of the voltage stabilizing transistor is coupled to a corresponding reference signal line, and a second electrode of the voltage stabilizing transistor is coupled to the intermediate node through the first conductive connection portion.

Optionally, the display substrate further includes a plurality of gate lines, and the gate electrode of the compensation transistor is coupled to a corresponding gate line; the gate line includes at least a portion extending along a first direction, the first conductive connection portion includes at least a portion extending along a second direction, and the first direction intersects the second direction; an orthographic projection of the first conductive connection portion on the base substrate at least partially overlaps an orthographic projection of the gate line on the base substrate.

Optionally, the sub-pixel driving circuit further includes a storage capacitor, the storage capacitor includes a first electrode plate and a second electrode plate oppositely arranged, and the first electrode plate is multiplexed as the gate electrode of the driving transistor, and an orthographic projection of the second electrode plate on the base substrate at least partially overlaps the orthographic projection of the first conductive connection portion on the base substrate.

Optionally, the reference signal line includes a plurality of first reference portions and a plurality of second reference portions, and the plurality of first reference portions and the plurality of second reference portions are arranged alternately; the first reference portion includes at least a portion extending along the second direction, an orthographic projection of the first reference portion on the base substrate and the orthographic projection of the first conductive connection portion on the base substrate are arranged along the first direction.

Optionally, the sub-pixel driving circuit further includes a second conductive connection portion, the second conductive connection portion includes at least a portion extending along the second direction, the second conductive connection portion is respectively coupled to the gate electrode of the driving transistor and the second electrode of the compensation transistor; at least part of the orthographic projection of the first reference portion on the base substrate is located between the orthographic projection of the first conductive connection portion on the base substrate and the orthographic projection of the second conductive connection portion on the base substrate.

Optionally, the compensation transistor includes a compensating active layer, an orthographic projection of the compensating active layer on the base substrate at least partially overlaps the orthographic projection of the first reference portion on the base substrate.

Optionally, the compensation active layer includes a first active pattern and a second active pattern, and the first active pattern is one of the two sub-transistors, the second active pattern is the other of the two sub-transistors; the first active pattern includes at least a portion extending along the first direction, and the second active pattern includes at least a portion extending along the second direction; an orthographic projection of the first active pattern on the base substrate at least partially overlaps the orthographic projection of the first reference portion on the base substrate, and an orthographic projection of the second active pattern on the base substrate at least partially overlaps the orthographic projection of the first reference portion on the base substrate.

Optionally, the sub-pixel driving circuit includes a light emitting control transistor and a connection pattern; the connection pattern is respectively coupled to the second electrode of the driving transistor, the first electrode of the compensation transistor and a first electrode of the light emitting control transistor; the connection pattern includes at least a portion extending along the second direction, and an orthographic projection of the connection pattern on the base substrate at least partially overlaps the orthographic projection of the first reference portion on the base substrate.

Optionally, the voltage stabilizing transistor comprises a voltage stabilizing active layer; at least part of the orthographic projection of the connection pattern on the base substrate and the orthographic projection of the second active pattern on the base substrate are staggered along the first direction; the connection pattern and at least part of the voltage stabilizing active layer are arranged along the first direction.

Optionally, the orthographic projection of the first conductive connection portion on the base substrate is located between orthographic projections of adjacent second reference portions on the base substrate.

Optionally, the second reference portion includes at least a portion extending along the second direction; the second reference portion and the first reference portion are staggered along the first direction; the reference signal line further includes a plurality of third reference portions, the third reference portion is respectively coupled to an adjacent first reference portion and an adjacent second reference portion.

Optionally, the voltage stabilizing transistor includes a voltage stabilizing active layer, and at least part of an orthographic projection of the voltage stabilizing active layer on the base substrate and the orthographic projection of the first conductive connection portion on the base substrate are arranged along the second direction; an orthographic projection of the voltage stabilizing active layer on the base substrate at least partially overlaps the orthographic projection of the second reference portion on the base substrate.

Optionally, the display substrate further includes a plurality of second light emitting control lines and a plurality of second initialization signal lines; the sub-pixels also include a light emitting element, the sub-pixel driving circuit further includes a second reset transistor, a gate electrode of the second reset transistor is coupled to a corresponding second light emitting control line, a first electrode of the second reset transistor is coupled to a corresponding second initialization signal line, and a second electrode of the second reset transistor is coupled to an anode of the light emitting element; the second reset transistor includes a second reset active layer, and the second reset active layer includes at least a portion extending along the second direction; an orthographic projection of the second reset active layer on the base substrate partially overlaps an orthographic projection of the second light emitting control line on the base substrate and an orthographic projection of the second initialization signal line on the base substrate respectively.

Optionally, the sub-pixel driving circuit further includes a third conductive connection portion, and the third conductive connection portion is respectively coupled to the first electrode of the second reset transistor and the second initialization signal line; an orthographic projection of the third conductive connection portion on the base substrate partially overlaps an orthographic projection of the second light emitting control line on the base substrate and an orthographic projection of the second initialization signal line on the base substrate.

Optionally, the third conductive connection portion includes a main body portion, a first protruding portion and a second protruding portion; the main body portion extends along the first direction, a first end of the main body portion is coupled to the first protruding portion, a second end of the main body portion is coupled to the second protruding portion, along the second direction, the first protruding portion is located on a first side of the main body portion, the second protruding portion is located on a second side of the main body portion, and the first protruding portion is coupled to the second initialization signal line, the second protruding portion is coupled to the first electrode of the second reset transistor.

Optionally, the display substrate further includes a plurality of data lines and a plurality of power supply lines; the plurality of power supply line, the first conductive connection portion an the reference signal line are arranged at a same layer and made of a same material, the data line and the power supply line are arranged at different layers, and the data line is located on a side of the power supply line away from the base substrate.

Optionally, the display substrate further includes: a plurality of power supply lines, a plurality of reset lines, a plurality of gate lines and a plurality of first initialization signal lines; the sub-pixel driving circuit further includes a first reset transistor, a data writing-in transistor and a power control transistor; a gate electrode of the first reset transistor is coupled to a corresponding reset line, a first electrode of the first reset transistor is coupled to a corresponding first initialization signal line, and a second electrode of the first reset transistor is coupled to the gate electrode of the driving transistor; a gate electrode of the data writing-in transistor is coupled to a corresponding gate line, a first electrode of the data writing-in transistor is coupled to a corresponding data line, and a second electrode of the data writing-in transistor is coupled to the first electrode of the driving transistor; a gate electrode of the power control transistor is coupled to a corresponding first light emitting control line, a first electrode of the power control transistor is coupled to the power supply line, and a second electrode of the power control transistor is coupled to the first electrode of the driving transistor.

In a second aspect, an embodiment of the present disclosure provides a display device including the display substrate.

BRIEF DESCRIPTION OF THE DRAWINGS

The drawings described herein are used to provide a further understanding of the present disclosure and constitute a portion of the present disclosure. The schematic embodiments and their descriptions of the present disclosure are used to explain the present disclosure, and do not constitute an improper limitation of the present disclosure.

DETAILED DESCRIPTION

Figure 1:
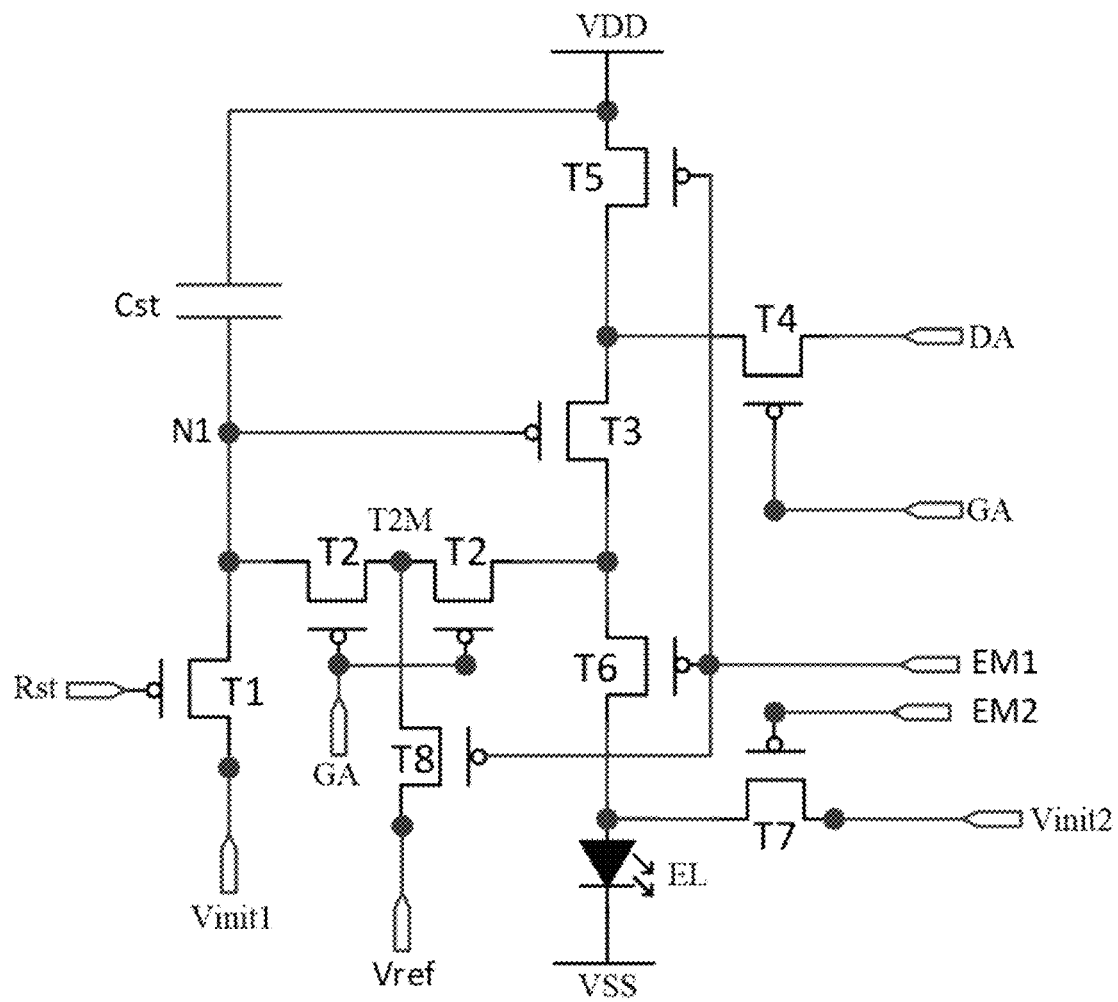
FIG. 1 is a circuit structural diagram of a sub-pixel driving circuit provided by an embodiment of the present disclosure.

In order to further explain the display substrate and display device provided by the embodiments of the present disclosure, the following will be described in detail with reference to the drawings of the disclosure.

The present disclosure provides a display substrate, which includes sub-pixel driving circuits arranged in an array, and the sub-pixel driving circuit includes a driving transistor and a compensation transistor, and the compensation transistor is connected between a second electrode of the driving transistor and a gate electrode of the driving transistor. The compensation transistor includes a double-gate transistor including an intermediate node.

In the above-mentioned display substrate, since the potential of the intermediate node is easily affected by other surrounding signals, the compensation transistor will leak current when the display substrate is in the light emitting phase, which will lead to the flickering problem of the display substrate applied to the display screen.

Referring to FIG. 1 to FIG. 4, an embodiment of the present disclosure provides a display substrate, including: a base substrate, a plurality of sub-pixels arranged on the base substrate, a plurality of reference signal lines Vref and a plurality of first light emitting control lines EM1; the sub-pixel includes a sub-pixel driving circuit, and the sub-pixel driving circuit includes: a driving transistor T3, a compensation transistor T2, a voltage stabilizing transistor T8 and a first conductive connection portion 11;

A first electrode of the compensation transistor T2 is coupled to a second electrode of the driving transistor T3, a second electrode of the compensation transistor T2 is coupled to a gate electrode T3-g of the driving transistor T3, and the compensation transistor T2 includes a double-gate transistor, the double-gate transistor includes two sub-transistors connected in series, and active patterns of the two sub-transistors are coupled to form an intermediate node T2M;

A gate electrode of the voltage stabilizing transistor T8 is coupled to a corresponding first light emitting control line EM1, a first electrode of the voltage stabilizing transistor T8 is coupled to a corresponding reference signal line Vref, and a second electrode of the voltage stabilizing transistor T8 is coupled to the intermediate node T2M through the first conductive connection portion 11.

Exemplarily, the display substrate includes a plurality of sub-pixels, and the plurality of sub-pixel driving circuits included in the plurality of sub-pixels are arranged in an array. The plurality of sub-pixel driving circuits are divided into a plurality of rows of sub-pixel driving circuits and a plurality of columns of sub-pixel driving circuits. The plurality of rows of sub-pixel driving circuits are arranged along the second direction, and each row of sub-pixel driving circuits includes a plurality of sub-pixel driving circuits arranged along the first direction. The plurality of columns of sub-pixel driving circuits are arranged along the first direction, and each column of sub-pixel driving circuits includes a plurality of sub-pixel driving circuits arranged along the second direction. Exemplarily, the first direction intersects the second direction. For example: the first direction includes the horizontal direction, and the second direction includes the longitudinal direction.

Exemplarily, the sub-pixel includes a sub-pixel driving circuit and a light emitting element EL. The sub-pixel driving circuit is coupled to the anode of the light emitting element EL, and is used to provide a driving signal for the light emitting element to drive the light emitting element to emit light. The cathode of the light emitting element EL is connected to the negative power supply signal VSS. Exemplarily, the sub-pixel driving circuit includes an 8T1C circuit (that is, includes 8 thin film transistors and one capacitor), but is not limited thereto.

Exemplarily, the plurality of reference signal lines Vref correspond to the plurality of columns of sub-pixel driving circuits in a one-to-one manner. The plurality of first light emitting control lines EM1 correspond to the plurality of rows of sub-pixel driving circuits in a one-to-one manner.

Exemplarily, the reference signal line Vref includes at least a portion extending along the second direction. The first emitting control line EM1 includes at least a portion extending along the first direction.

Exemplarily, the double-gate transistor includes two sub-transistors connected in series, the gate electrodes of the two sub-transistors are coupled to each other, and the active patterns of the two sub-transistors are coupled to form an intermediate node T2M.

Exemplarily, the reference signal line Vref is used to provide a reference signal, and the reference signal is an adjustable direct current signal. The first light emitting control line EM1 is used for providing a first light emitting control signal. When the first light emitting control signal is at an active level (such as low level), the voltage stabilizing transistor T8 is turned on, and transmits the reference signal to the intermediate node T2M to stabilize the potential of the intermediate node T2M.

Exemplarily, in the light emitting phase, the voltage stabilizing transistor T8 is turned on to transmit the reference signal to the intermediate node T2M, so as to stabilize the potential of the intermediate node T2M.

Exemplarily, a driving chip (IC) in the display substrate provides a reference signal for the reference signal line Vref, and can control the voltage value of the reference signal.

According to the specific structure of the above-mentioned display substrate, in the display substrate provided by the embodiment of the present disclosure, by setting the gate electrode of the voltage stabilizing transistor T8 to be coupled to the corresponding first light emitting control line EM1, the first electrode of the voltage stabilizing transistor T8 is coupled to the corresponding reference signal line Vref, the second electrode of the voltage stabilizing transistor T8 is coupled to the intermediate node T2M through the first conductive connection portion 11, and the voltage stabilizing transistor T8 can be controlled to provide a stable reference signal to the intermediate node T2M, to stabilize the voltage of the intermediate node T2M, thereby eliminating the influence of other surrounding signals on the intermediate node T2M, and avoiding the leakage of the compensation transistor T2 when the display substrate is in the light emitting phase, thereby avoiding flickering problem when the display screen to which the display substrate is applied displays. The display screen to which the display substrate is provided according to the embodiments of the present disclosure has a better display effect and greatly improves product performance.

Moreover, since the reference signal is a DC voltage signal that can be adjusted according to needs, under different gray scale brightness, a matching reference signal can be provided to the intermediate node T2M for voltage stabilization, which can effectively prevent the current leak of the compensation transistor T2 when the display substrate is in the light emitting phase.

In addition, the second electrode of the voltage stabilizing transistor T8 is coupled to the intermediate node T2M through the first conductive connection portion 11, so that the first conductive connection portion 11 can cross over the conductive structure near the intermediate node T2M, which avoids the short circuit between the second electrode of the voltage stabilizing transistor T8 and the conductive structure, and effectively reduces the layout difficulty of the sub-pixel driving circuit.

Referring to FIG. 1 to FIG. 4, in some embodiments, the display substrate further includes a plurality of gate lines GA, and the gate electrode of the compensation transistor T2 is coupled to the corresponding gate line GA;

The gate line GA includes at least a portion extending along a first direction, the first conductive connection portion 11 includes at least a portion extending along a second direction, and the first direction intersects the second direction; an orthographic projection of the first conductive connection portion 11 on the base substrate at least partially overlaps an orthographic projection of the gate line GA on the base substrate.

Exemplarily, the plurality of gate lines GA correspond to the plurality of rows of sub-pixel driving circuits in a one-to-one manner.

Exemplarily, the gate electrode of the compensation transistor T2 and the corresponding gate line GA form an integral structure.

Exemplarily, the gate line GA is multiplexed as the gate electrode of the compensation transistor T2.

The orthographic projection of the first conductive connection portion 11 on the base substrate at least partially overlaps the orthographic projection of the gate line GA on the base substrate, so that the first conductive connection portion 11 can cross over the gate line GA and is coupled to the intermediate node T2M, which avoids the short circuit between the second electrode of the voltage stabilizing transistor T8 and the gate line GA, which not only reduces the layout difficulty of the sub-pixel driving circuit, but also improves the reliability of the display substrate.

Referring to FIG. 1 to FIG. 4, in some embodiments, the sub-pixel driving circuit further includes a storage capacitor Cst, the storage capacitor Cst includes a first electrode plate Cst1 and a second electrode plate Cst2 oppositely arranged, and the first electrode plate Cst1 is multiplexed as the gate electrode T3-g of the driving transistor T3, and an orthographic projection of the second electrode plate Cst2 on the base substrate at least partially overlaps the orthographic projection of the first conductive connection portion 11 on the base substrate.

Exemplarily, the storage capacitor Cst includes a first electrode plate Cst1 and a second electrode plate Cst2 oppositely arranged, at least portion of the first electrode plate Cst1 is located between the second electrode plate Cst2 and the base substrate.

Exemplarily, the second electrode plate Cst2 is coupled to the power supply line VDD in the display substrate. The second electrode plates Cst2 included in the same row of sub-pixel driving circuits are sequentially coupled to form an integral structure. This arrangement makes the power supply line VDD and the second electrode plate Cst2 form a grid structure covering the display substrate, through which the power signal is transmitted, the drop of the power signal can be effectively reduced, and at the same time, the uniformity of the display can be effectively improved.

The orthographic projection of the second electrode plate Cst2 on the base substrate at least partially overlaps the orthographic projection of the first conductive connection portion 11 on the base substrate, so that the first conductive connection portion 11 can cross over the second electrode plate Cst2 to be coupled to the intermediate node T2M, which avoids the short circuit between the second electrode of the voltage stabilizing transistor T8 and the second electrode plate Cst2, and not only reduces the layout difficulty of the sub-pixel driving circuit, but also enhance the reliability of the display substrate.

Figure 7:
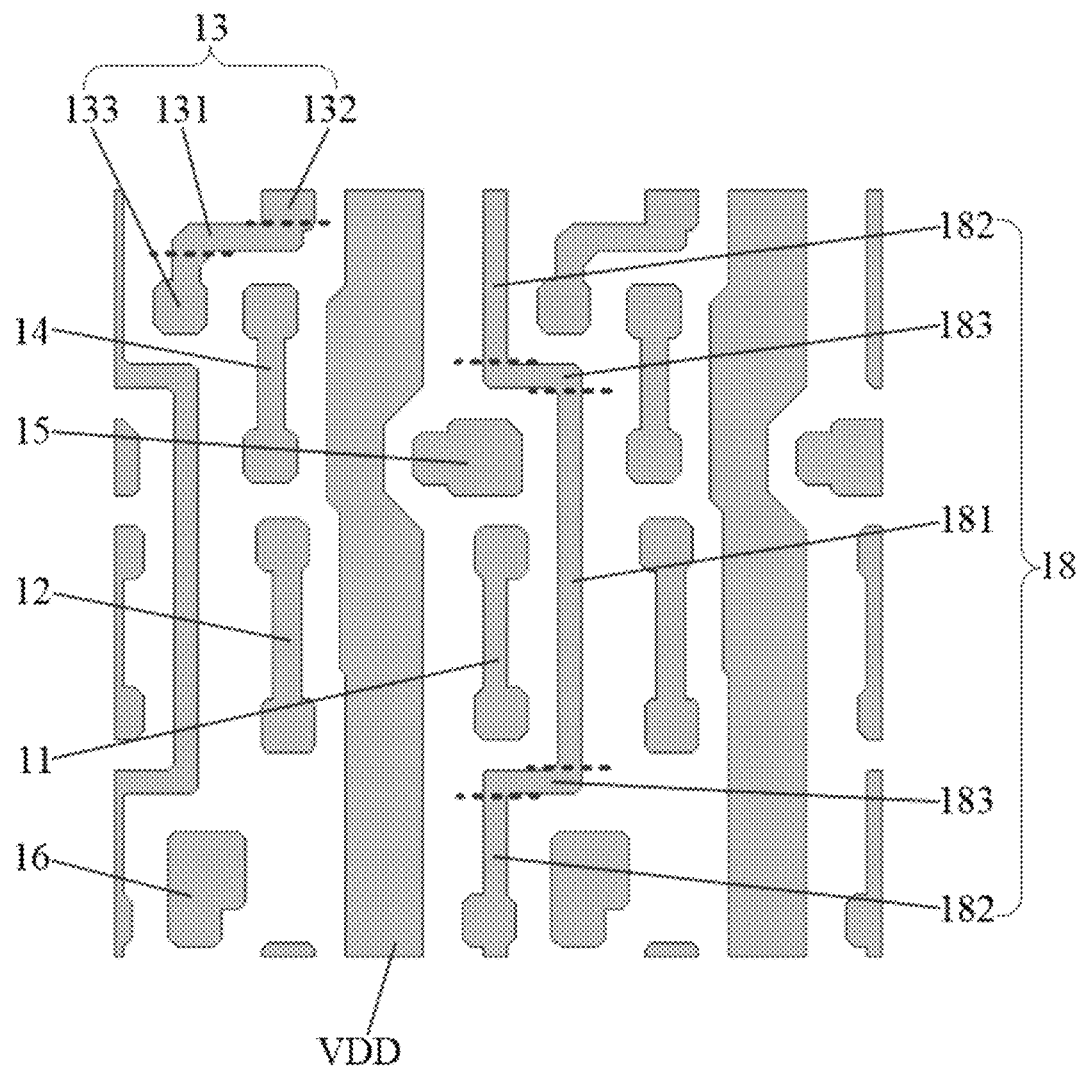
FIG. 7 is a schematic layout diagram of the first source-drain metal layer in FIG. 2.

As shown in FIG. 7, in some embodiments, the reference signal line Vref includes a plurality of first reference portions 181 and a plurality of second reference portions 182, and the first reference portions 181 and the second reference portions 182 are arranged alternately; the first reference portion 181 includes at least a portion extending along the second direction, the orthographic projection of the first reference portion 181 on the base substrate and the orthographic projection of the first conductive connection portion 11 on the base substrate are arranged along the first direction.

Exemplarily, the first reference portions 181 and the second reference portions 182 are arranged alternately along the second direction. The first reference portion 181 and the second reference portion 182 form an integral structure.

Exemplarily, the first reference portion 181 includes a strip structure extending along the second direction. The second reference portion 182 includes a strip structure extending along the second direction.

Exemplarily, the orthographic projection of the first reference portion 181 on the base substrate partially overlaps the orthographic projection of the gate line GA on the base substrate. The orthographic projection of the first reference portion 181 on the base substrate partially overlaps the orthographic projection of the second electrode plate Cst2 on the base substrate. The orthographic projection of the first reference portion 181 on the base substrate partially overlaps the orthographic projection of the reset line Rst in the display substrate on the base substrate.

Exemplarily, the first reference portion 181 and the first conductive connection portion 11 are arranged at the same layer and made of the same material.

The above arrangement is beneficial to reduce the layout difficulty of the reference signal line Vref, reduce the risk of short circuit between the reference signal line Vref and other conductive structures, and reduce the influence of the reference signal line Vref on the transmittance of the display substrate.

As shown in FIG. 7, in some embodiments, the sub-pixel driving circuit further includes a second conductive connection portion 12, the second conductive connection portion 12 includes at least a portion extending along the second direction, the second conductive connection portion 12 is respectively coupled to the gate electrode T3-g of the driving transistor T3 and the second electrode of the compensation transistor T2; at least part of the orthographic projection of the first reference portion 181 on the base substrate is located between the orthographic projection of the first conductive connection portion 11 on the base substrate and the orthographic projection of the second conductive connection portion 12 on the base substrate.

Exemplarily, the second conductive connection portion 12 and the first conductive connection portion 11 are arranged at the same layer and made of the same material.

Exemplarily, the second conductive connection portion 12 and the first conductive connection portion 11 are arranged along the first direction.

At least part of the orthographic projection of the first reference portion 181 on the base substrate is located between the orthographic projection of the first conductive connection portion 11 on the base substrate and the orthographic projection of the second conductive connection portion 12 on the base substrate; which is beneficial to reduce the layout difficulty of the reference signal line Vref, and can reduce the risk of short circuit between the reference signal line Vref and other conductive structures.

Figure 3:
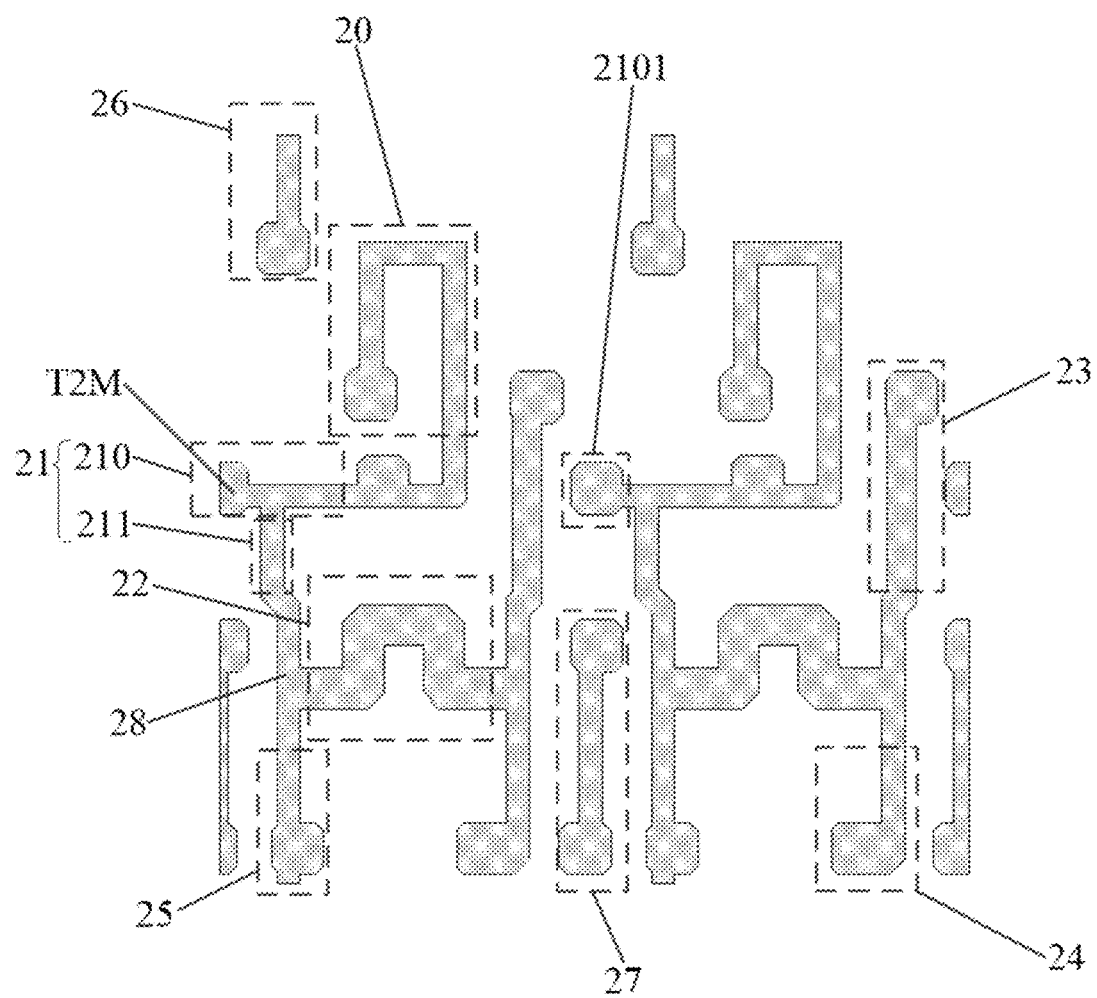
FIG. 3 is a schematic layout diagram of the active layer in FIG. 2.
Figure 6:
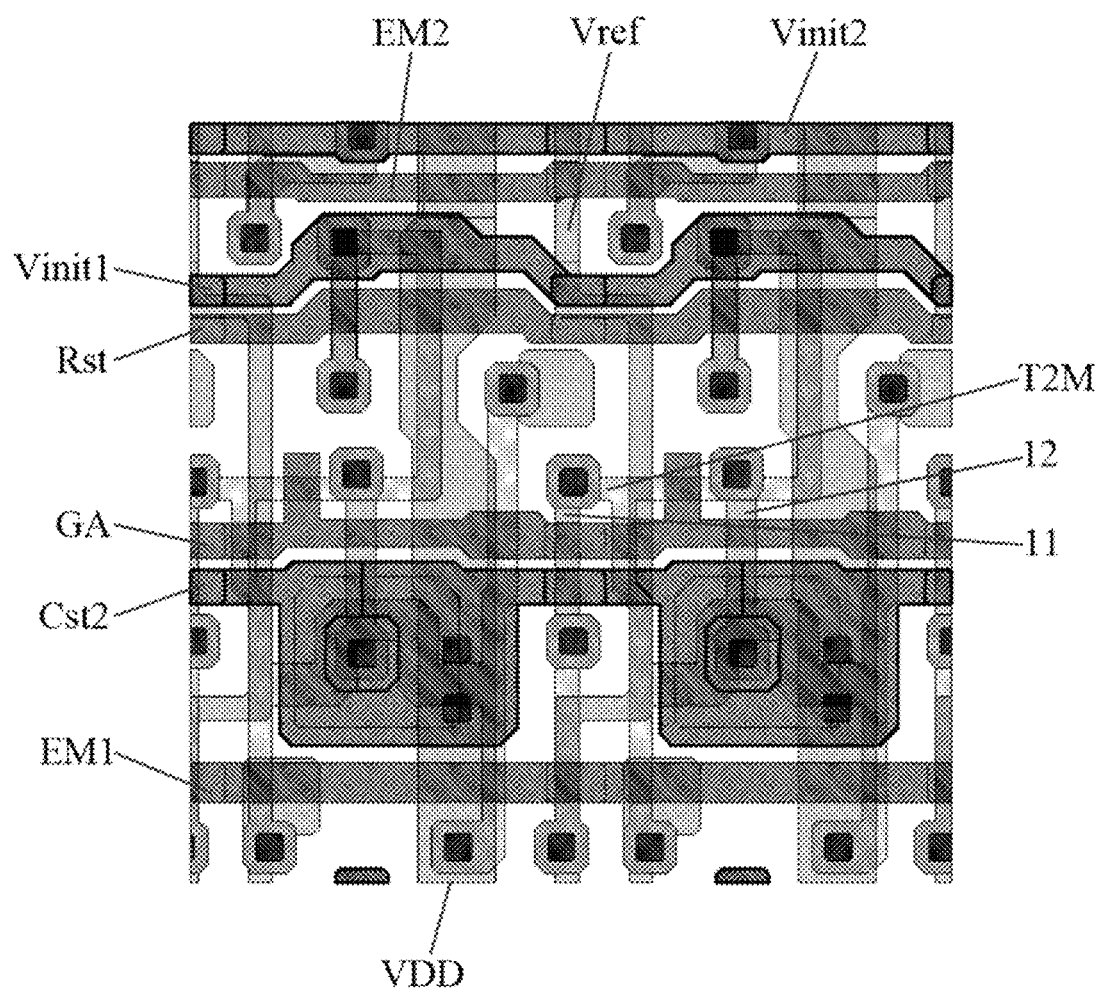
FIG. 6 is a schematic layout diagram of adding a first source-drain metal layer in FIG. 5.

As shown in FIG. 3, FIG. 6 and FIG. 7, in some embodiments, the compensation transistor T2 includes compensating the active layer 21, the orthographic projection of the compensating active layer 21 on the base substrate at least partially overlaps the orthographic projection of the first reference portion 181 on the base substrate.

Exemplarily, the compensation active layer 21 is used to form the channel portion of the compensation transistor T2, the first electrode and the second electrode of the compensation transistor T2, and the intermediate node T2M.

The above arrangement is beneficial to reduce the layout difficulty of the reference signal line Vref, reduce the risk of short circuit between the reference signal line Vref and other conductive structures, and reduce the influence of the reference signal line Vref on the transmittance of the display substrate.

As shown in FIG. 3, FIG. 6 and FIG. 7, in some embodiments, the compensation active layer 21 includes a first active pattern 210 and a second active pattern 211, and the first active pattern 210 is one of the two sub-transistors, the second active pattern 211 is the other of the two sub-transistors;

The first active pattern 210 includes at least a portion extending along the first direction, and the second active pattern 211 includes at least a portion extending along the second direction; the orthographic projection of the first active pattern 210 on the base substrate at least partially overlaps the orthographic projection of the first reference portion 181 on the base substrate, and the orthographic projection of the second active pattern 211 on the base substrate at least partially overlaps the orthographic projection of the first reference portion 181 on the base substrate.

Exemplarily, the first active pattern 210 and the second active pattern 211 form an integral structure. The first active pattern 210 forms the channel portion, the first electrode and the second electrode of the one sub-transistor. The second active pattern 211 forms the channel portion, the first electrode and the second electrode of the other sub-transistor. The second electrode of the one sub-transistor serves as the second electrode of the compensation transistor T2, the first electrode of the one sub-transistor is coupled to the second electrode of the other sub-transistor to form the intermediate node T2M, and the first electrode of the other sub-transistor serves as the first electrode of the compensation transistor T2.

As shown in FIG. 3, for example, one end of the first active pattern 210 coupled to the second active pattern 211 includes an extension portion 2101, and the extension portion 2101 protrudes from the second active pattern along the first direction. There is an overlapping area between the orthographic projection of the extension portion 2101 on the base substrate and the orthographic projection of the first conductive connection portion 11 on the base substrate have, the extension portion 2101 and the first conductive connecting portion 11 is coupled through a via hole located in the overlapping area.

Exemplarily, the first active pattern 210 includes a bar pattern extending along the first direction, and the second active pattern 211 includes a bar pattern extending along the second direction.

Exemplarily, the orthographic projection of the first active pattern 210 on the base substrate partially overlaps the orthographic projection of the first reference portion 181 on the base substrate, and the orthographic projection of the second active pattern 211 on the base substrate partially overlaps the orthographic projection of the first reference portion 181 on the base substrate.

Exemplarily, the orthographic projection of the second active pattern 211 on the base substrate is covered by the orthographic projection of the first reference portion 181 on the base substrate.

The above arrangement is beneficial to reduce the layout difficulty of the reference signal line Vref, reduce the risk of short circuit between the reference signal line Vref and other conductive structures, and reduce the influence of the reference signal line Vref on the transmittance of the display substrate.

As shown in FIG. 2 to FIG. 7, in some embodiments, the sub-pixel driving circuit includes a light emitting control transistor T6 and a connection pattern 28; the connection pattern 28 is respectively coupled to the second electrode of the driving transistor T3, the first electrode of the compensation transistor T2 and the first electrode of the light emitting control transistor T6;

The connection pattern 28 includes at least a portion extending along the second direction, and the orthographic projection of the connection pattern 28 on the base substrate at least partially overlaps the orthographic projection of the first reference portion 181 on the base substrate.

Exemplarily, the connection pattern 28 is made of a poly layer in the display substrate, the connection pattern 28, the second electrode of the driving transistor T3, the first electrode of the compensation transistor T2 and the first electrode of the light emitting control transistor T6 form an integral structure.

Exemplarily, the orthographic projection of the connection pattern 28 on the base substrate is covered by the orthographic projection of the first reference portion 181 on the base substrate.

The above arrangement is beneficial to reduce the layout difficulty of the reference signal line Vref, reduce the risk of short circuit between the reference signal line Vref and other conductive structures, and reduce the influence of the reference signal line Vref on the transmittance of the display substrate.

As shown in FIG. 2 to FIG. 7, in some embodiments, the voltage stabilizing transistor T8 includes a voltage stabilizing active layer 27;

At least part of the orthographic projection of the connection pattern 28 on the base substrate and the orthographic projection of the second active pattern 211 on the base substrate are staggered along the first direction; the connection pattern 28 and at least part of the voltage stabilizing active layer 27 are arranged along the first direction.

Exemplarily, the voltage stabilizing active layer 27 includes a strip structure at least partially extending along the second direction.

Exemplarily, at least part of the orthographic projection of the connection pattern 28 on the base substrate and the orthographic projection of the second active pattern 211 on the base substrate are staggered along the first direction. At least part of the orthographic projection of the connection pattern 28 on the base substrate and the orthographic projection of the second active pattern 211 on the base substrate are staggered along the second direction.

The above layout method reduces the layout difficulty of the display substrate in a limited layout space, and ensures the reliability of the display substrate.

As shown in FIG. 7, in some embodiments, the orthographic projection of the first conductive connection portion 11 on the base substrate is located between orthographic projections of adjacent second reference portions 182 on the base substrate.

Exemplarily, the display substrate further includes a plurality of data lines DA, the data line DA includes a data main portion DA1 and a data protruding portion DA2, the data main portion DA1 extends along the second direction, and the data protruding portion DA2 protrudes from the data body portion 131 along the first direction.

Exemplarily, at least part of the orthographic projection of the data main portion DA1 on the base substrate and the orthographic projection of the second reference portion 182 on the base substrate are arranged along the first direction.

Exemplarily, the orthographic projection of the data main portion DA1 on the base substrate partially overlaps the orthographic projection of the second reference portion 182 on the base substrate.

Exemplarily, the orthographic projection of the data main portion DA1 on the base substrate does not overlap the orthographic projection of the second reference portion 182 on the base substrate.

Exemplarily, at least part of the orthographic projection of the data protruding portion DA2 on the base substrate is located between the orthographic projection of the second reference portion 182 on the base substrate and the orthographic projection of the first conductive connection portion 11 on the base substrate.

As shown in FIGS. 6 and 7, for example, the orthographic projection of the second reference portion 182 on the base substrate partially overlaps the orthographic projection of the second initialization signal line Vinit2 in the display substrate on the base substrate. The orthographic projection of the second reference portion 182 on the base substrate partially overlaps the orthographic projection of the second light emitting control line EM2 in the display substrate on the base substrate. The orthographic projection of the second reference portion 182 on the base substrate partially overlaps the orthographic projection of the first initialization signal line Vinit1 on the base substrate.

Exemplarily, the orthographic projection of the second reference portion 182 on the base substrate partially overlaps the orthographic projection of the reset line Rst in the display substrate on the base substrate.

Exemplarily, the orthographic projection of the second reference portion 182 on the base substrate partially overlaps the orthographic projection of the first light emitting control line EM1 in the display substrate on the base substrate.

The above layout method minimizes the layout space occupied by the reference signal line Vref and the first conductive connection portion 11, reduces the layout difficulty of the display substrate in a limited layout space, and ensures the reliability of the display substrate.

As shown in FIGS. 6 and 7, in some embodiments, the second reference portion 182 includes at least a portion extending along the second direction; the second reference portion 182 and the first reference portion 181 are staggered along the first direction;

The reference signal line Vref further includes a plurality of third reference portions 183, the third reference portion 183 is respectively coupled to an adjacent first reference portion 181 and an adjacent second reference portion 182.

Exemplarily, the third reference portion 183, the first reference portion 181 and the second reference portion 182 form an integral structure.

Exemplarily, the third reference portion 183 is a strip structure extending along the first direction.

Exemplarily, an angle of 90 degrees is formed between the third reference portion 183 and the first reference portion 181 coupled thereto. An angle of 90 degrees is formed between the third reference portion 183 and the second reference portion 182 coupled thereto.

Exemplarily, the angle formed between the third reference portion 183 and the first reference portion 181 coupled thereto is greater than 90 degrees. The angle formed between the third reference portion 183 and the second reference portion 182 coupled thereto is less than 90 degrees.

Exemplarily, the angle formed between the third reference portion 183 and the first reference portion 181 coupled thereto is less than 90 degrees. The angle formed between the third reference portion 183 and the second reference portion 182 coupled thereto is greater than 90 degrees.

As shown in FIG. 6 and FIG. 7, for example, the orthographic projection of a part of the third reference portion 183 (such as: the third reference portion 183 located at the top in FIG. 7) on the base substrate at least partially overlaps the orthographic projection of the first initialization signal line Vinit1 on the base substrate. The orthographic projection of a part of the third reference portion 183 on the base substrate at least partially overlaps the orthographic projection of the reset line Rst in the display substrate on the base substrate.

As shown in FIG. 6 and FIG. 7, for example, the orthographic projection of a part of the third reference portion 183 (such as: the third reference portion 183 located at the bottom in FIG. 7) on the base substrate does not overlap the orthographic projection of the first initialization signal line Vinit1 in the display substrate on the base substrate. The orthographic projection of a part of the third reference portion 183 on the base substrate does not overlap the orthographic projection of the reset line Rst in the display substrate on the base substrate.

The above layout method minimizes the layout difficulty of the reference signal line Vref in the limited layout space, and ensures the reliability of the display substrate.

Figure 4:
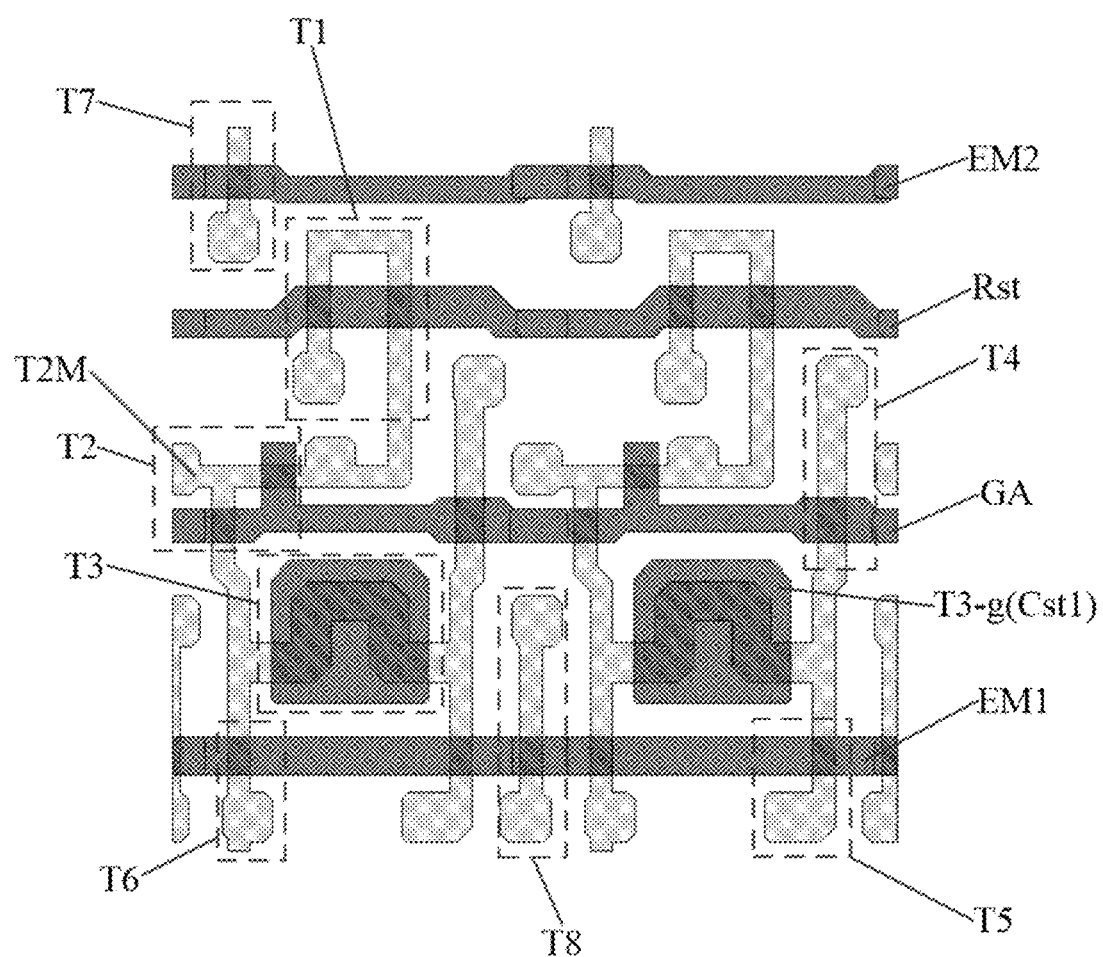
FIG. 4 is a schematic layout diagram of the active layer and the first gate metal layer in FIG. 2.

As shown in FIG. 3, FIG. 4 and FIG. 7, in some embodiments, the voltage stabilizing transistor T8 includes a voltage stabilizing active layer 27, and at least part of an orthographic projection of the voltage stabilizing active layer 27 on the base substrate and the orthographic projection of the first conductive connection portion 11 on the base substrate are arranged along the second direction;

The orthographic projection of the voltage stabilizing active layer 27 on the base substrate at least partially overlaps the orthographic projection of the second reference portion 182 on the base substrate.

Exemplarily, the voltage stabilizing active layer 27 includes at least a portion extending along the second direction. At least part of the orthographic projection of the voltage stabilizing active layer 27 on the base substrate and at least part of the orthographic projection of the data line DA on the base substrate are arranged along the first direction.

Exemplarily, the voltage stabilizing active layer 27 is used to form the channel portion of the voltage stabilizing transistor T8, and the first electrode and the second electrode of the voltage stabilizing transistor T8. There are forms an overlapping area between the orthographic projection of a portion of the voltage stabilizing active layer 27 used to form the second electrode on the base substrate and the orthographic projection of the first conductive connection portion 11 on the base substrate. The portion of the voltage stabilizing active layer 27 used to form the second electrode is coupled to the first conductive connection portion 11 through a via hole. An orthographic projection of a remaining portion of the voltage stabilizing active layer 27 other than the second electrode on the base substrate and the orthographic projection of the first conductive connection portion 11 on the base substrate are arranged along the second direction.

Exemplarily, the light emitting control transistor T6 includes a light emitting control active layer 25, and the light emitting control active layer 25 and the voltage stabilizing active layer 27 are arranged along the first direction.

Exemplarily, the orthographic projection of the portion of the voltage stabilizing active layer 27 used to form a channel on the base substrate is covered by the orthographic projection of the second reference portion 182 on the base substrate.

The above arrangement is beneficial to reduce the layout difficulty of the reference signal line Vref, reduce the risk of short circuit between the reference signal line Vref and other conductive structures, and reduce the influence of the reference signal line Vref on the transmittance of the display substrate.

In the display substrate provided by the above embodiment, the reference signal is inputted through the voltage stabilizing transistor T8, and transmitted to the first conductive connection portion through the via hole between the voltage stabilizing active layer 27 and the first conductive connection portion 11, and then transmitted to the intermediate node T2M through the via hole between the first conductive connection portion 11 and the intermediate node T2M. The layout method of the reference signal line Vref effectively utilizes the layout space and can avoid interference from other signal lines.

As shown in FIG. 1 to FIG. 6, in some embodiments, the display substrate further includes a plurality of second light emitting control lines EM2 and a plurality of second initialization signal lines Vinit2; the sub-pixels also include a light emitting element, the sub-pixel driving circuit further includes a second reset transistor T7, the gate electrode of the second reset transistor T7 is coupled to the corresponding second light emitting control line EM2, the first electrode of the second reset transistor T7 is coupled to the corresponding second initialization signal line Vinit2, and the second electrode of the second reset transistor T7 is coupled to the anode of the light emitting element;

The second reset transistor T7 includes a second reset active layer 26, and the second reset active layer 26 includes at least a portion extending along the second direction; the orthographic projection of the second reset active layer 26 on the base substrate partially overlaps the orthographic projection of the second light emitting control line EM2 on the base substrate and the orthographic projection of the second initialization signal line Vinit2 on the base substrate respectively.

Exemplarily, the plurality of second light emitting control lines EM2 correspond to the plurality of rows of sub-pixel driving circuits in a one-to-one manner. The plurality of second initialization signal lines Vinit2 correspond to the plurality of rows of sub-pixel driving circuits in a one-to-one manner.

Exemplarily, the second light emitting control line EM2 includes at least a portion extending along the first direction. The second initialization signal line Vinit2 includes at least a portion extending along the first direction.

Exemplarily, the second light emitting control line EM2 is used to provide a second light emitting control signal, and the second initialization signal line Vinit2 is used to provide a second initialization signal. The second reset transistor T7 is used to transmit the second initialization signal to the anode of the light emitting element under the control of the second light emitting control signal.

Exemplarily, the second reset active layer 26 and the light emitting control active layer 25 included in the light emitting control transistor T6 form an integral structure.

In the display substrate provided in the above embodiment, by setting the second reset transistor T7 to be coupled to the second light emitting control line EM2 and the second initialization signal line Vinit2 respectively, the second reset transistor T7 can be controlled by a separate gate driving circuit (GOA circuit), so that the second reset transistor T7 can be in an ON state in all phases other than the light emitting phase, and can realize repeated and continuous initialization of the anode of the light emitting element, so that the initialization of the anode is more sufficient, the light emitting initial state of each sub-pixel is as consistent as possible, thereby improving the display effect of the display screen.

In addition, by setting the orthographic projection of the second reset active layer 26 on the base substrate partially overlapping the orthographic projection of the second light emitting control line EM2 on the base substrate and the orthographic projection of the second initialization signal line Vinit2 on the base substrate, so as to minimize the layout space occupied by the second reset transistor T7, which is beneficial for the display substrate to realize high-resolution display.

As shown in FIG. 1 to FIG. 7, in some embodiments, the sub-pixel driving circuit further includes a third conductive connection portion 13, and the third conductive connection portion 13 is respectively coupled to the first electrode of the second reset transistor T7 and the second initialization signal line Vinit2; the orthographic projection of the third conductive connection portion 13 on the base substrate partially overlaps the orthographic projection of the second light emitting control line EM2 on the base substrate and the orthographic projection of the second initialization signal line Vinit2 on the base substrate.

Exemplarily, the third conductive connection portion 13, the first conductive connection portion 11 and the second conductive connection portion 12 are arranged at the same layer and made of the same material.

The above arrangement of the first electrode of the second reset transistor T7 being coupled to the second initialization signal line Vinit2 through the third conductive connection portion 13 effectively reduces the layout difficulty of the second reset transistor T7.

The orthographic projection of the third conductive connection portion 13 on the base substrate partially overlaps the orthographic projection of the second light emitting control line EM2 on the base substrate and the orthographic projection of the second initialization signal line Vinit2 on the base substrate, which is beneficial to reduce the layout space occupied by the sub-pixel driving circuit as a whole, and is beneficial to the display substrate to realize high-resolution display.

As shown in FIGS. 1 to 7, in some embodiments, the third conductive connection portion 13 includes a main body portion 131, a first protruding portion 132 and a second protruding portion 133; the main body portion 131 extends along the first direction, the first end of the main body portion 131 is coupled to the first protruding portion 132, the second end of the main body portion 131 is coupled to the second protruding portion 133, along the second direction, the first protruding portion 132 is located on the first side of the main body portion 131, the second protruding portion 133 is located on the second side of the main body portion 131, and the first protruding portion 132 is coupled to the second initialization signal line Vinit2. Then, the second protruding portion 133 is coupled to the first electrode of the second reset transistor T7.

Exemplarily, the first side and the second side are opposite along the second direction.

Exemplarily, the orthographic projection of the first protruding portion 132 on the base substrate does not overlap the orthographic projection of the second reset active layer 26 on the base substrate.

The above arrangement ensures that the third conductive connection portion 13 can be respectively coupled to the second initialization signal line Vinit2 and the first electrode of the second reset transistor T7, and at the same time, the layout difficulty of the third conductive connection portion 13 is reduced.

Figure 2:
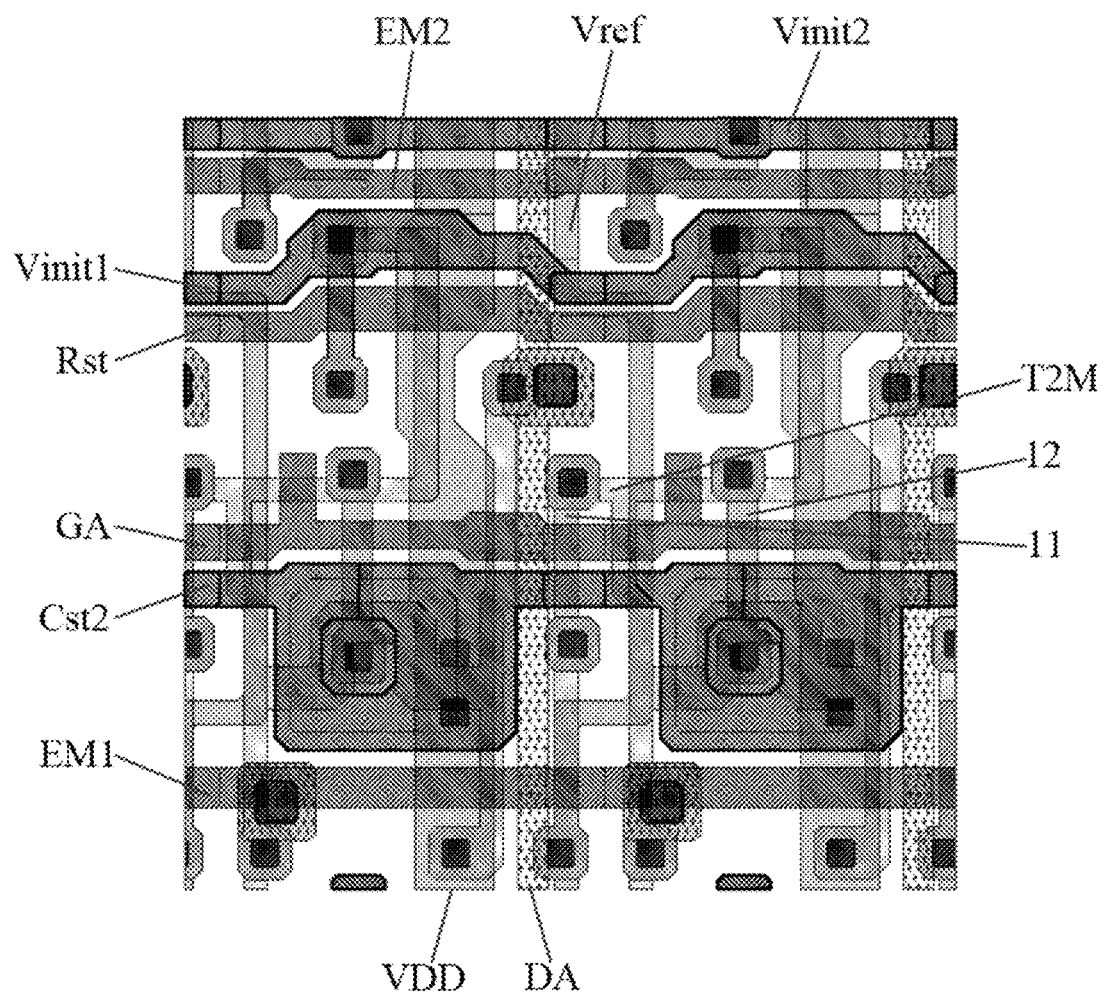
FIG. 2 is a schematic layout diagram of two sub-pixel driving circuits provided by an embodiment of the present disclosure.
Figure 8:
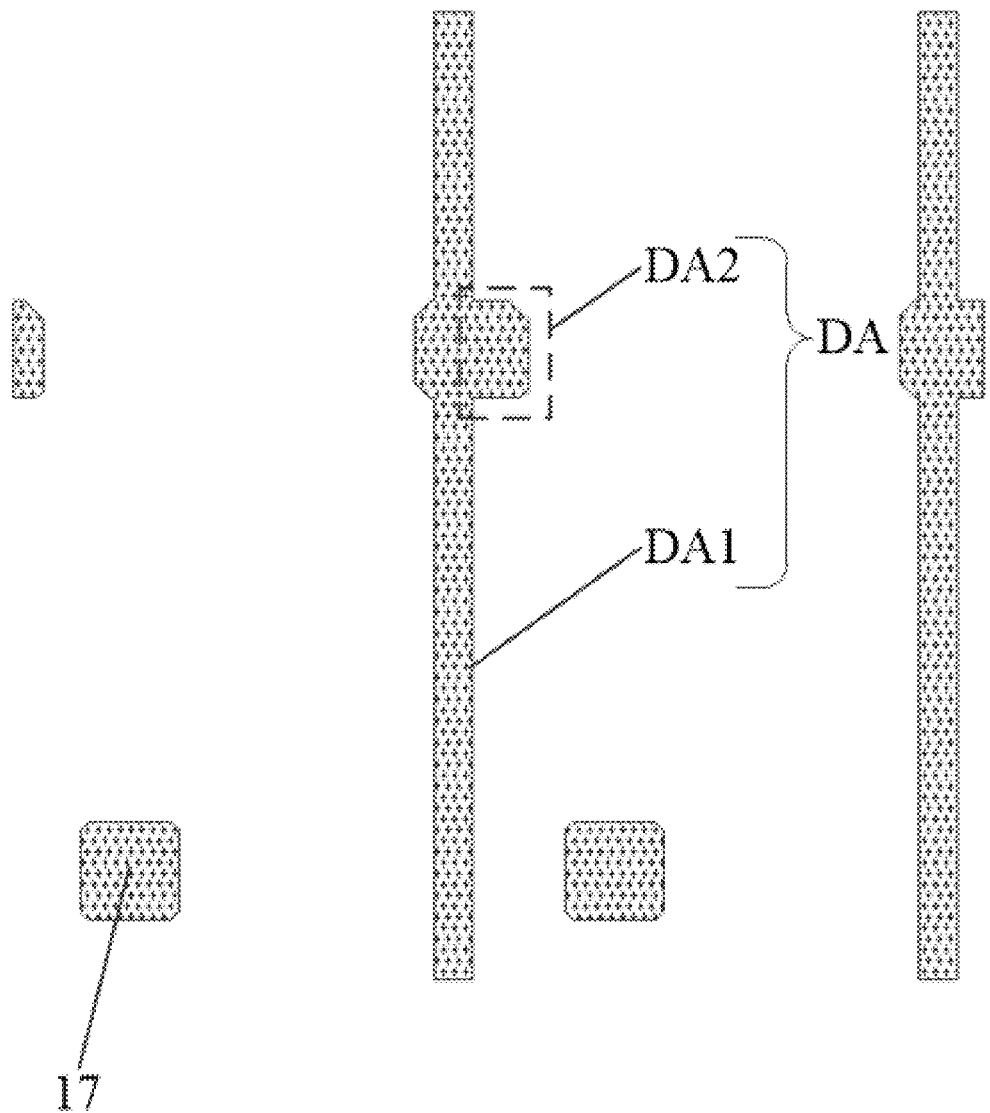
FIG. 8 is a schematic layout diagram of the second source-drain metal layer in FIG. 2.

As shown in FIG. 2, FIG. 7 and FIG. 8, in some embodiments, the display substrate further includes a plurality of data lines DA and a plurality of power supply lines VDD; the power supply line VDD, the first conductive connection portion 11 an the reference signal line Vref are arranged at the same layer and made of the same material. The data line DA and the power supply line VDD are set in different layers, and the data line DA is located on the side of the power supply line VDD away from the base substrate.

Exemplarily, the plurality of data lines DA correspond to the plurality of columns of sub-pixel driving circuits in a one-to-one manner. The plurality of power supply lines VDD correspond to the plurality of columns of sub-pixel driving circuits in a one-to-one manner.

Exemplarily, the power line VDD, the first conductive connection portion 11 and the reference signal line Vref are all made of the first source-drain metal layer in the display substrate, and the data line DA is made of the second source-drain metal layer in the display substrate.

As mentioned above, the power supply line VDD, the first conductive connection portion 11 and the reference signal line Vref are arranged at the same layer and made of the same material, so that the power supply line VDD, the first conductive connection portion 11 and the reference signal line Vref can be formed simultaneously in the same patterning process, which greatly simplifies the manufacturing process of the display substrate and reduces the manufacturing cost.

In the above arrangement, a thicker first planarization layer is formed between the data line DA and the lower metal layer, that is, the organic layer, which reduces the parasitic capacitance formed between the data line DA and the lower metal layer, and greatly weakens the interaction between the data line DA and the lower metal layer, improves the crosstalk problem and the display performance.

The above arrangement of the data line DA on the side of the power line VDD away from the base substrate can effectively save layout space and facilitate the realization of high-resolution pixel design of the display substrate.

As shown in FIGS. 1 to 4, in some embodiments, the display substrate further includes: a plurality of power supply lines VDD, a plurality of reset lines Rst, a plurality of gate lines GA and a plurality of first initialization signal lines Vinit1;

The sub-pixel driving circuit further includes a first reset transistor T1, a data writing-in transistor T4 and a power control transistor T5;

The gate electrode of the first reset transistor T1 is coupled to the corresponding reset line Rst, the first electrode of the first reset transistor T1 is coupled to the corresponding first initialization signal line Vinit1, and the second electrode of the first reset transistor T1 is coupled to the gate electrode T3-$g$ of the driving transistor T3;

The gate electrode of the data writing-in transistor T4 is coupled to the corresponding gate line GA, the first electrode of the data writing-in transistor T4 is coupled to the corresponding data line DA, and the second electrode of the data writing-in transistor T4 is coupled to the first electrode of the driving transistor T3;

The gate electrode of the power control transistor T5 is coupled to the corresponding first light emitting control line EM1, the first electrode of the power control transistor T5 is coupled to the power supply line VDD, and the second electrode of the power control transistor T5 is coupled to the first electrode of the driving transistor T3.

Exemplarily, the plurality of reset lines Rst correspond to the plurality of rows of sub-pixels in a one-to-one manner. The plurality of gate lines GA correspond to the plurality of rows of sub-pixels in a one-to-one manner. The plurality of first initialization signal lines Vinit1 correspond to the plurality of rows of sub-pixels in a one-to-one manner.

In more detail, the sub-pixel driving circuit includes a first reset transistor T1, a compensation transistor T2, a driving transistor T3, a data writing-in transistor T4, a power control transistor T5, a light emitting control transistor T6, a second reset transistor T7, a voltage stabilizing transistor T8 and a storage capacitor Cst.

When the sub-pixel driving circuit with the above structure is in operation, each working period includes a reset phase, a writing-in compensation phase and a light emitting phase.

In the reset phase, the reset signal inputted by the reset line Rst is at an active level, the first reset transistor T1 is turned on, and the first initialization signal transmitted by the first initialization signal line Vinit1 is inputted to the gate electrode T3-$g$ of the driving transistor T3, so that the gate-source voltage Vgs maintained on the driving transistor T3 in the previous frame is cleared, and the gate electrode T3-$g$ of the driving transistor T3 is reset. The second light emitting control signal inputted by the second light emitting control line EM2 is at an active level, and the second reset transistor T7 is controlled to be turned on, and the second initialization signal inputted by the second initialization signal line Vinit2 is inputted to the anode of the light emitting element EL, and the anode is initialized, and the light emitting element EL is controlled not to emit light.

In the writing-in compensation phase, the reset signal is at an inactive level, the first reset transistor T1 is turned off, the gate scanning signal inputted by the gate line GA is at an active level, and the compensation transistor T2 and the data writing-in transistor T4 are controlled to be turned on, the data signal is written into the data line DA, and transmitted to the first electrode of the driving transistor T3 through the data writing-in transistor T4, and at the same time, the compensation transistor T2 and the data writing-in transistor T4 are turned on, so that the driving transistor T3 forms a diode structure, Therefore, the compensation transistor T2, the driving transistor T3 and the data writing-in transistor T4 work together to realize the threshold voltage compensation of the driving transistor T3. When the compensation time is long enough, the potential of the gate electrode T3-$g$ of the driving transistor T3 can be controlled to finally reach Vdata+Vth, wherein, Vdata represents the voltage value of the data signal, and Vth represents the threshold voltage of the driving transistor T3. The second light emitting control signal inputted by the second light emitting control line EM2 continues to be at an active level, and the second reset transistor T7 is controlled to be turned on, and the second initialization signal inputted by the second initialization signal line Vinit2 is inputted to the anode of the light emitting element EL. The anode is initialized to control the light emitting element EL not to emit light.

In the light emitting phase, the first light emitting control signal written by the first light emitting control line EM1 is at an active level, and the power control transistor T5 and the light emitting control transistor T6 are controlled to be turned on, so that the power supply signal transmitted by the power supply line VDD is inputted to the first electrode of the driving transistor T3. At the same time, because the gate electrode T3-g of the driving transistor T3 is kept at Vdata+Vth, the driving transistor T3 is turned on, and the gate-source voltage corresponding to the driving transistor T3 is Vdata+Vth-VDD, wherein VDD is the voltage value of power supply signal, the leakage current generated by the gate-source voltage flows to the anode of the corresponding light emitting element EL, drives the corresponding light emitting element EL to emit light. The second light emitting control signal inputted by the second light emitting control line EM2 is at an inactive level, and controls the second reset transistor T7 to be turned off. The first light emitting control signal written by the first light emitting control line EM1 is at an active level, and controls the voltage stabilizing transistor to be turned on, so that the reference signal provided by the reference signal line is transmitted to the intermediate node.

The display substrate provided by the above embodiment includes: an active layer, a first gate insulating layer, a first gate metal layer, a second gate insulating layer, a second gate metal layer, an interlayer insulation layer, a first source-drain metal layer, a first planarization layer, a second source-drain metal layer, a second planarization layer, an anode layer, a pixel definition layer, a light emitting functional layer, a cathode layer and an encapsulation layer that are sequentially stacked on the base substrate along a direction away from the base substrate. The display substrate may also include a passivation layer.

As shown in FIG. 3, the active layer is used to form: the first reset active layer 20 included in the first reset transistor T1, the compensation active layer 21 included in the compensation transistor T2, the driving active layer 22 included in the drive transistor T3, a data writing-in active layer 23 included in the data writing-in transistor T4, a power control active layer 24 included in the power control transistor T5, a light emitting control active layer 25 included in and the light emitting control transistor T6, a second reset active layer 26 included in the second reset transistor T7, a voltage stabilizing active layer 27 included in the voltage stabilizing transistor T8, and some conductive structures. The active layer is also used to form the connection pattern 28.

As shown in FIG. 4, the first gate metal layer is used to form: the second light emitting control line EM2, the reset line Rst, the gate line GA and the first light emitting control line EM1, and the electrode of each transistor.

Figure 5:
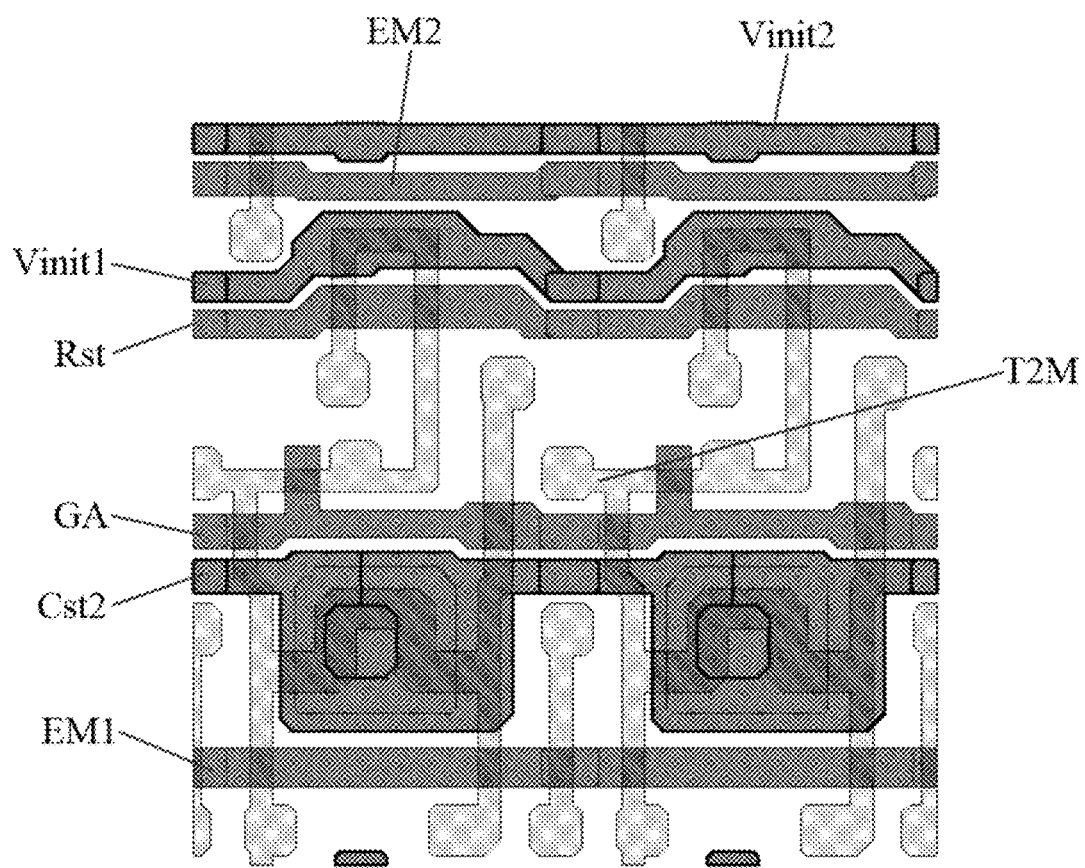
FIG. 5 is a schematic layout diagram of adding a second gate metal layer in FIG. 4.

As shown in FIG. 5, the second gate metal layer is used to form: the first initialization signal line Vinit1, the second initialization signal line Vinit2, and the second electrode plate Cst2 of the storage capacitor Cst.

As shown in FIG. 6 and FIG. 7, the first source-drain metal layer is used to form: the power supply line VDD, the reference signal line Vref, the first conductive connection portion 11, the second conductive connection portion 12, the third conductive connection portion 13, the fourth conductive connection portion 14, the fifth conductive connection portion 15 and the sixth conductive connection portion 16. The fourth conductive connection portion 14 is used to connect the first electrode of the first reset transistor T1 to the first initialization signal line Vinit1. The first electrode of the data writing-in transistor T4 is coupled to the fifth conductive connection portion 15, and the fifth conductive connection portion 15 is coupled to the corresponding data line DA. The second electrode of the light emitting control transistor T6 is coupled to the sixth conductive connection portion 16, the sixth conductive connection portion 16 is coupled to the seventh conductive connection portion 17, and the seventh conductive connection portion 17 is coupled to the corresponding anode.

As shown in FIG. 8, the second source-drain metal layer is used to form: the data line DA and the seventh conductive connection portion 17.

The manufacturing process flow of the display substrate provided in the above-mentioned embodiments is as follows: forming an organic PI substrate on a glass substrate; depositing an active material layer on the organic PI substrate, covering a photoresist on the active material layer; obtaining the active layer by etching and other processes.

Continuing to deposit an inorganic medium layer on the active layer to form a first gate insulating layer.

Depositing a first gate metal material layer on the first gate insulating layer, covering the first gate metal material layer with the photoresist, and then obtaining the first gate metal layer through exposure, development, dry etching and other processes.

Continuing to deposit an inorganic medium layer on the first gate metal layer to form a second gate insulating layer.

Depositing a second gate metal material layer on the second gate insulating layer, covering the second gate metal material layer with the photoresist, and then obtaining the second gate metal layer through exposure, development, dry etching and other processes.

Depositing and forming an interlayer insulating layer on the second gate metal layer, covering the interlayer insulating layer with the photoresist, and then patterning the interlayer insulating layer through exposing, developing, dry etching and other processes.

Depositing and forming a first source-drain metal material layer on the interlayer insulating layer, covering the first source-drain metal material layer with the photoresist, and then obtaining the first source-drain metal layer through exposure, development, and dry etching and other processes.

Depositing and forming a first planarization layer on the first source-drain metal layer, covering the first planarization layer with the photoresist, and then patterning the first planarization layer through exposure, development, and dry etching and other processes.

Depositing and forming a second source-drain metal material layer on the first planarization layer, covering the second source-drain metal material layer with the photoresist, and then obtaining the second source-drain metal layer through exposure, development, and dry etching and other processes.

Embodiments of the present disclosure also provide a display device, including the display substrate provided in the above embodiments.

In the display substrate provided by the above embodiment, the gate electrode of the voltage stabilizing transistor T8 is coupled to the corresponding first light emitting control line EM1, the first electrode of the voltage stabilizing transistor T8 is coupled to the corresponding reference signal line Vref, the second electrode of the voltage stabilizing transistor T8 is coupled to the intermediate node T2M through the first conductive connection portion 11, and can control the voltage stabilizing transistor T8 to supply a stable reference signal to the intermediate node T2M, to stabilize the voltage of the intermediate node T2M, thereby eliminating the influence of other peripheral signals on the intermediate node T2M, avoiding the current leakage of the compensation transistor T2 when the display substrate is in the light emitting phase, and further avoid the flicking problem when the display panel applied to the display substrate displays. The display screen applied to the display substrate provided by the above embodiments has a better display effect, which greatly improves product performance. Moreover, since the reference signal is a DC voltage signal that can be adjusted according to needs, under different gray scale brightness, a matching reference signal can be provided to the intermediate node T2M for voltage stabilization, which can more effectively prevent the current leakage of the compensation transistor T2 when the display substrate is in the light emitting phase. In addition, the second electrode of the voltage stabilizing transistor T8 is set to be coupled to the intermediate node T2M through the first conductive connection portion 11, so that the first conductive connection portion 11 can cross over the conductive connection near the intermediate node T2M, thereby avoiding the short circuit between the second electrode of the voltage stabilizing transistor T8 and the conductive structure, and effectively reducing the layout difficulty of the sub-pixel driving circuit.

When the display device provided by the embodiments of the present disclosure includes the display substrate, it also has the above-mentioned beneficial effects, which will not be repeated herein.

It should be noted that the display device can be any product or component with a display function such as a TV, a monitor, a digital photo frame, a mobile phone, a tablet computer, etc., wherein the display device also includes a flexible circuit board, a printed circuit board and a back panel etc.

It should be noted that the extension of the signal line along the X direction means that the signal line includes a main portion and a secondary portion connected to the main portion, the main portion is a line, a line segment or a bar shape, and the main portion extends along the X direction, and the length of the main portion along the X direction is greater than the length of the secondary portion along other directions.

It should be appreciated that, the expression "at a same layer" refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include a plurality of exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a base substrate, a plurality of sub-pixels arranged on the base substrate, a plurality of reference signal lines and a plurality of first light emitting control lines; wherein the sub-pixel includes a sub-pixel driving circuit, and the sub-pixel driving circuit includes: a driving transistor, a compensation transistor, a voltage stabilizing transistor and a first conductive connection portion;

a first electrode of the compensation transistor is coupled to a second electrode of the driving transistor, a second electrode of the compensation transistor is coupled to a gate electrode of the driving transistor, and the compensation transistor includes a double-gate transistor, the double-gate transistor includes two sub-transistors connected in series, and active patterns of the two sub-transistors are coupled to form an intermediate node;

a gate electrode of the voltage stabilizing transistor is coupled to a corresponding first light emitting control line, a first electrode of the voltage stabilizing transistor is coupled to a corresponding reference signal line, and a second electrode of the voltage stabilizing transistor is coupled to the intermediate node through the first conductive connection portion, wherein the display substrate further includes a plurality of gate lines, and the gate electrode of the compensation transistor is coupled to a corresponding gate line; the gate line includes at least a portion extending along a first direction, the first conductive connection portion includes at least a portion extending along a second direction, and the first direction intersects the second direction; an orthographic projection of the first conductive connection portion on the base substrate at least partially overlaps an orthographic projection of the gate line on the base substrate.

2. The display substrate according to claim 1, wherein the sub-pixel driving circuit further includes a storage capacitor, the storage capacitor includes a first electrode plate and a second electrode plate oppositely arranged, and the first electrode plate is multiplexed as the gate electrode of the driving transistor, and an orthographic projection of the second electrode plate on the base substrate at least partially overlaps the orthographic projection of the first conductive connection portion on the base substrate.

3. The display substrate according to claim 1, wherein the reference signal line includes a plurality of first reference portions and a plurality of second reference portions, and the plurality of first reference portions and the plurality of second reference portions are arranged alternately; the first reference portion includes at least a portion extending along the second direction, an orthographic projection of the first reference portion on the base substrate and the orthographic projection of the first conductive connection portion on the base substrate are arranged along the first direction.

4. The display substrate according to claim 3, wherein the sub-pixel driving circuit further includes a second conductive connection portion, the second conductive connection portion includes at least a portion extending along the second direction, the second conductive connection portion is respectively coupled to the gate electrode of the driving transistor and the second electrode of the compensation transistor;
at least part of the orthographic projection of the first reference portion on the base substrate is located between the orthographic projection of the first conductive connection portion on the base substrate and the orthographic projection of the second conductive connection portion on the base substrate.

5. The display substrate according to claim 4, wherein the compensation transistor includes a compensating active layer, an orthographic projection of the compensating active layer on the base substrate at least partially overlaps the orthographic projection of the first reference portion on the base substrate.

6. The display substrate according to claim 5, wherein the compensation active layer includes a first active pattern and a second active pattern, and the first active pattern is one of the two sub-transistors, the second active pattern is the other of the two sub-transistors;
the first active pattern includes at least a portion extending along the first direction, and the second active pattern includes at least a portion extending along the second direction; an orthographic projection of the first active pattern on the base substrate at least partially overlaps the orthographic projection of the first reference portion on the base substrate, and an orthographic projection of the second active pattern on the base substrate at least partially overlaps the orthographic projection of the first reference portion on the base substrate.

7. The display substrate according to claim 6, wherein the sub-pixel driving circuit includes a light emitting control transistor and a connection pattern; the connection pattern is respectively coupled to the second electrode of the driving transistor, the first electrode of the compensation transistor and a first electrode of the light emitting control transistor;
the connection pattern includes at least a portion extending along the second direction, and an orthographic projection of the connection pattern on the base substrate at least partially overlaps the orthographic projection of the first reference portion on the base substrate.

8. The display substrate according to claim 7, wherein the voltage stabilizing transistor comprises a voltage stabilizing active layer;
at least part of the orthographic projection of the connection pattern on the base substrate and the orthographic projection of the second active pattern on the base substrate are staggered along the first direction; the connection pattern and at least part of the voltage stabilizing active layer are arranged along the first direction.

9. The display substrate according to claim 3, wherein the orthographic projection of the first conductive connection portion on the base substrate is located between orthographic projections of adjacent second reference portions on the base substrate.

10. The display substrate according to claim 9, wherein the second reference portion includes at least a portion extending along the second direction; the second reference portion and the first reference portion are staggered along the first direction;
the reference signal line further includes a plurality of third reference portions, the third reference portion is respectively coupled to an adjacent first reference portion and an adjacent second reference portion.

11. The display substrate according to claim 9, wherein the voltage stabilizing transistor includes a voltage stabilizing active layer, and at least part of an orthographic projection of the voltage stabilizing active layer on the base substrate and the orthographic projection of the first conductive connection portion on the base substrate are arranged along the second direction;
an orthographic projection of the voltage stabilizing active layer on the base substrate at least partially overlaps the orthographic projection of the second reference portion on the base substrate.

12. The display substrate according to claim 1, wherein the display substrate further includes a plurality of second light emitting control lines and a plurality of second initialization signal lines; the sub-pixels also include a light emitting element, the sub-pixel driving circuit further includes a second reset transistor, a gate electrode of the second reset transistor is coupled to a corresponding second light emitting control line, a first electrode of the second reset transistor is coupled to a corresponding second initialization signal line, and a second electrode of the second reset transistor is coupled to an anode of the light emitting element;
the second reset transistor includes a second reset active layer, and the second reset active layer includes at least a portion extending along the second direction; an orthographic projection of the second reset active layer on the base substrate partially overlaps an orthographic projection of the second light emitting control line on the base substrate and an orthographic projection of the second initialization signal line on the base substrate respectively.

13. The display substrate according to claim 12, wherein the sub-pixel driving circuit further includes a third conductive connection portion, and the third conductive connection portion is respectively coupled to the first electrode of the second reset transistor and the second initialization signal line; an orthographic projection of the third conductive connection portion on the base substrate partially overlaps an orthographic projection of the second light emitting control line on the base substrate and an orthographic projection of the second initialization signal line on the base substrate.

14. The display substrate according to claim 13, wherein the third conductive connection portion includes a main body portion, a first protruding portion and a second protruding portion; the main body portion extends along the first direction, a first end of the main body portion is coupled to the first protruding portion, a second end of the main body portion is coupled to the second protruding portion, along the second direction, the first protruding portion is located on a first side of the main body portion, the second protruding portion is located on a second side of the main body portion, and the first protruding portion is coupled to the second initialization signal line, the second protruding portion is coupled to the first electrode of the second reset transistor.

15. The display substrate according to claim 1, wherein the display substrate further includes a plurality of data lines and a plurality of power supply lines; the plurality of power supply line, the first conductive connection portion and the reference signal line are arranged at a same layer and made of a same material, the data line and the power supply line are arranged at different layers, and the data line is located on a side of the power supply line away from the base substrate.

16. The display substrate according to claim 1, wherein the display substrate further includes: a plurality of power supply lines, a plurality of reset lines, a plurality of gate lines and a plurality of first initialization signal lines;

the sub-pixel driving circuit further includes a first reset transistor, a data writing-in transistor and a power control transistor;

a gate electrode of the first reset transistor is coupled to a corresponding reset line, a first electrode of the first reset transistor is coupled to a corresponding first initialization signal line, and a second electrode of the first reset transistor is coupled to the gate electrode of the driving transistor;

a gate electrode of the data writing-in transistor is coupled to a corresponding gate line, a first electrode of the data writing-in transistor is coupled to a corresponding data line, and a second electrode of the data writing-in transistor is coupled to the first electrode of the driving transistor;

a gate electrode of the power control transistor is coupled to a corresponding first light emitting control line, a first electrode of the power control transistor is coupled to the power supply line, and a second electrode of the power control transistor is coupled to the first electrode of the driving transistor.

17. A display device, comprising the display substrate according to claim 1.

* * * * *